United States Patent
Wittmann et al.

(10) Patent No.: US 9,911,934 B2
(45) Date of Patent: Mar. 6, 2018

(54) OLED AND METHOD FOR PRODUCING AN OLED

(71) Applicant: OSRAM OLED GmbH, Regensburg (DE)

(72) Inventors: Sebastian Wittmann, Regensburg (DE); Arne Fleissner, Regensburg (DE); Erwin Lang, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/421,859

(22) Filed: Feb. 1, 2017

(65) Prior Publication Data

US 2017/0244053 A1   Aug. 24, 2017

(30) Foreign Application Priority Data

Feb. 1, 2016 (DE) .......................... 10 2016 101 710

(51) Int. Cl.
| | |
|---|---|
| *H01L 51/50* | (2006.01) |
| *H01L 51/00* | (2006.01) |
| *H01L 51/56* | (2006.01) |
| *H01L 51/52* | (2006.01) |

(52) U.S. Cl.
CPC ...... *H01L 51/0097* (2013.01); *H01L 51/0003* (2013.01); *H01L 51/0011* (2013.01); *H01L 51/56* (2013.01); *H01L 51/5056* (2013.01); *H01L 51/5072* (2013.01); *H01L 51/5206* (2013.01); *H01L 51/5221* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 6,351,067 B2 * | 2/2002 | Lee ..................... | H01L 51/5088 313/504 |
| 6,611,096 B1 * | 8/2003 | McCormick ........ | H01L 51/0035 313/506 |
| 7,504,770 B2 * | 3/2009 | Choong .............. | H01L 51/5265 313/112 |

(Continued)

FOREIGN PATENT DOCUMENTS

| | | |
|---|---|---|
| CN | 104979490 A | 10/2015 |
| DE | 10310341 A1 | 10/2003 |

(Continued)

*Primary Examiner* — Michael Lebentritt
(74) *Attorney, Agent, or Firm* — Slater Matsil, LLP

(57) ABSTRACT

An OLED and a method for producing an OLED are disclosed. In an embodiment, the OLED includes a substrate and an organic layer stack with at least one active light-generating layer, which is suitable for generating electromagnetic radiation, wherein the organic layer stack is arranged between a first electrode and a second electrode. The OLED further includes a buffer layer arranged between the substrate and the first electrode, wherein the buffer layer includes an organic material, wherein a polymeric planarization layer is in direct contact with the substrate, wherein the buffer layer is in direct contact with the polymeric planarization layer, and wherein the first electrode is in direct contact with the buffer layer.

18 Claims, 3 Drawing Sheets

(56) References Cited

U.S. PATENT DOCUMENTS

| | | | | |
|---|---|---|---|---|
| 8,304,270 B2* | 11/2012 | Huang | | H01L 51/441 |
| | | | | 257/E29.068 |
| 8,350,258 B2* | 1/2013 | Seo | | H01L 51/5253 |
| | | | | 257/40 |
| 8,519,612 B2* | 8/2013 | Yoon | | H01L 51/5284 |
| | | | | 313/483 |
| 8,623,684 B2* | 1/2014 | Huang | | H01L 51/5048 |
| | | | | 257/E51.012 |
| 8,963,420 B2* | 2/2015 | Lee | | H01L 51/5221 |
| | | | | 313/504 |
| 8,993,998 B2* | 3/2015 | Yang | | H01L 51/442 |
| | | | | 257/13 |
| 9,012,892 B2* | 4/2015 | Chen | | H01L 51/0005 |
| | | | | 257/40 |
| 9,293,733 B2* | 3/2016 | Setz | | H01L 51/5262 |
| 9,490,453 B2* | 11/2016 | Pan | | H01L 51/5268 |
| 9,520,575 B2 | 12/2016 | Lang et al. | | |
| 9,590,204 B2* | 3/2017 | Kobayashi | | H01L 51/5092 |
| 9,680,132 B1* | 6/2017 | Tsai | | H01L 51/5284 |
| 9,755,188 B2* | 9/2017 | Choi | | H01L 51/0097 |
| 2003/0184892 A1 | 10/2003 | Lu et al. | | |
| 2005/0175841 A1* | 8/2005 | Hikmet | | H01L 51/5253 |
| | | | | 428/411.1 |
| 2005/0269943 A1* | 12/2005 | Hack | | H01L 51/0097 |
| | | | | 313/504 |
| 2011/0049730 A1* | 3/2011 | Schmid | | C23C 16/0272 |
| | | | | 257/787 |
| 2011/0089408 A1 | 4/2011 | Schmid et al. | | |
| 2014/0107364 A1 | 4/2014 | Schmid et al. | | |
| 2014/0264313 A1 | 9/2014 | Schmid et al. | | |
| 2015/0123047 A1 | 5/2015 | Maltenberger et al. | | |

FOREIGN PATENT DOCUMENTS

| | | |
|---|---|---|
| DE | 112004000938 B4 | 12/2011 |
| DE | 102010062877 A1 | 6/2012 |
| DE | 102011084639 A1 | 4/2013 |
| DE | 102014114224 A1 | 3/2016 |
| DE | 102014114231 A1 | 3/2016 |
| KR | 20100022373 A | 3/2010 |
| WO | 2011033023 A1 | 3/2011 |
| WO | 2013057130 A1 | 4/2013 |
| WO | 2013072250 A1 | 5/2013 |
| WO | 2013182389 A2 | 12/2013 |

\* cited by examiner

OLED AND METHOD FOR PRODUCING AN OLED

This patent application claims the priority of German patent application 10 2016 101 710.8, filed Feb. 1, 2016, which is incorporated herein by reference in its entirety.

TECHNICAL FIELD

An organic light-emitting diode (OLED) and a method for producing an OLED are provided.

BACKGROUND

An OLED has been disclosed in WO 2013/072250 A1, for example.

SUMMARY OF THE INVENTION

Embodiments of the invention provide an OLED having an improved light-emitting surface. Furthermore, a method for producing such an OLED is to be provided.

In various embodiments an OLED comprises a substrate and an organic layer stack having at least one light-emitting layer, which is configured to generate electromagnetic radiation. Here, the organic layer stack is arranged between the first electrode and the second electrode.

The organic layer stack can comprise semiconductor materials or be formed from semiconductor materials. Organic semiconductors are semiconductors which are based on organic materials and have semiconducting properties.

Materials having a radiation emission due to fluorescence or phosphorescence such as 2- or 2,5-substituted poly-p-phenylene vinylene, as well as metal complexes, e.g., iridium-complexes such as blue-phosphorescent FIrPic (Bis(3,5-difluoro-2-(2-pyridyephenyl-(2-carboxypyridyl)-iridium III), green phosphorescent Ir(ppy)3 (Tris(2-phenylpyridine)iridium III), red phosphorescent Ru (dtb-bpy) 3*2(PF6) (Tris[4,4'-di-tert-butyl-(2,2')-bipyridine]ruthenium(III)complex) as well as blue fluorescent DPAVBi (4,4-Bis[4-(di-p-tolylamino)styryl]biphenyl), green fluorescent TTPA (9,10-Bis[N,N-di-(p-tolyl)-amino]anthracene) and red fluorescent DCM2 (4-Dicyanomethylene)-2-methyl-6-julolidyl-9-enyl-4H-pyran) are suitable as materials for the at least one organic-light-emitting layer.

Besides one or more light-emitting organic layers, the organic layer stack can also comprise further organic layers such as hole transport layers and electron transport layers.

Thus, it may be advantageous when the organic layer stack comprises one or more organic layers which are configured as hole transport layers in order to enable effective hole injection into the at least one light-emitting layer. For example, tertiary amines and carbazole derivatives may prove to be advantageous as materials for a hole transport layer.

Furthermore, for example, the following materials can be suitable for the hole transport layers:

N,N'-Bis(naphthalene-1-yl)-N,N'-bis(phenyl)-benzidine (NPB),
N,N'-Bis(naphthalene-2-yl)-N,N'-bis(phenyl)-benzidine (β-NPB),
N,N'-Bis(3-methylphenyl)-N,N'-bis(phenyl)-benzidine (TPD),
N,N'-Bis(3-methylphenyl)-N,N'-bis(phenyl)-9,9-spirobifluorene (Spiro-TPD),
N,N'-Bis(naphthalene-1-yl)-N,N'-bis(phenyl)-9,9-spirobifluorene (Spiro-NPB),
N,N'-Bis(3-methylphenyl)-N,N'-bis(phenyl)-9,9-dimethyl-fluorene (DMFL-TPD),
N,N'-Bis(naphthalene-1-yl)-N,N'-bis(phenyl)-9,9-dimethyl-fluorene (DMFL-NPB),
N,N'-Bis-(3-methylphenyl)-N,N'-bis(phenyl)-9,9-diphenyl-fluorene (DPFL-TPD),
N,N'-Bis(naphthalen-1-yl)-N,N'-bis(phenyl)-9,9-diphenyl-fluorene (DPFL-NPB),
2,2',7,7'-Tetrakis(N,N-diphenylamino)-9,9'-spirobifluorene (Spiro-TAD),
9,9-Bis[4-(N,N-bis-biphenyl-4-yl-amino)phenyl]-9H-fluorene (BPAPF),
9,9-Bis [4-(N,N-bis-naphthalene-2-yl-amino)phenyl]-9H-fluorene (NPAPF),
9,9-Bis[4-(N,N'-bis-naphthalene-2-yl-N,N'-bis-phenyl-amino)-phenyl]-9H-fluorene (NAPBAPF),
2,2',7,7'-Tetrakis [N-naphthalenyl(phenyl)-amino]-9,9-spirobifluorene (Spiro-2NPB),
N,N'-Bis(phenanthren-9-yl)-N,N'-bis(phenyl)-benzidin (PAPB),
2,7-Bis[N,N-bis(9,9-spiro-bifluorene-2-yl)-amino]-9,9-spirobifluorene (Spiro-S),
2,2'-Bis[N,N-bis(biphenyl-4-vl)amino]-9,9-spirobifluorene (2,2'-Spiro-DBP),
2,2'-Bis(N,N-di-phenyl-amino)-9,9-spirobifluorene (Spiro-BPA).

The hole transport layer can comprise a dopant. A metal oxide, a metalorganic compound, an organic material or a mixture thereof can be used as a dopant, for example, $WO_3$, $MoO_3$, $V_2O_5$, $Re_2O_7$ and $Re_2O_5$, Di-rhodium-tetra-trifluoroacetate ($Rh_2(TFA)_4$) or the isoelectronic ruthenium compound $Ru_2(TFA)_2(CO)_2$, or an organic material which comprises aromatic functional groups or which is an aromatic organic material, e.g., aromatic materials having a pronounced number of fluorine and/or cyanide (CN) substituents.

Furthermore, the organic layer stack can comprise one or more functional layers which are formed as electron transport layers. In addition, the layer stack can also comprise electron blocking layers and/or hole blocking layers.

For example, the electron-conducting-layer may comprise an electron transport layer, which comprises 2,9-Dimethyl-4,7-diphenyl-1,10-phenanthroline (BCP) or 4,7-Diphenyl-1,10-phenanthroline (BPhen), for example. Preferably, this material can comprise a dopant, which is selected from Li, $Cs_2CO_3$, $Cs_3Po_4$ or a molecular doping.

The first electrode and/or the second electrode may contain a transparent conductive oxide or consist of a transparent conductive oxide, for example.

Transparent conductive oxides (TCO, for short) usually are metal oxides such as zinc oxide, tin oxide, cadmium oxide, titanium oxide, indium oxide or indium tin oxide (ITO). Besides binary metal-oxygen compounds such as $ZnO$, $SnO_2$ or $In_2O_3$, ternary metal-oxygen compounds such as $Zn_2SnO_4$, $ZnSnO_3$, $MgIn_2O_4$, $GaInO_3$, $Zn_2In_2O_5$ or $In_4Sn_3O_{12}$ or mixtures of different transparent conductive oxides also belong to the TCO group. Furthermore, the TCOs do not necessarily correspond to a stoichiometric composition and can further also be p-doped as well as n-doped.

Furthermore, it is also possible that the first and/or the second electrode comprise a metal or are formed from a metal. For example, one of the following materials is suitable as a metal for one of the electrodes: aluminum, barium, indium, silver, gold, magnesium, calcium, lithium.

Particularly preferably, the OLED comprises a buffer layer, which is arranged between the substrate and the first electrode, wherein the buffer layer is formed from an organic material. Just like the organic layer stack, the buffer layer can be formed from an organic semiconductor material. Preferably, the buffer layer is formed from an organic material, which is or can be comprised by the organic layer stack as well.

According to an embodiment of the OLED, a lateral extent of the organic layer stack and a lateral extent of the buffer layer are equal within the manufacturing tolerances. For example, the buffer layer and the organic layer stack have the same basic shape within the manufacturing tolerances. Preferably, within the manufacturing tolerances, the buffer layer and the organic layer stack are arranged in a congruent manner. As used herein, the phrase "within the manufacturing tolerances" can mean that the deviations are equal to or less than 600 micrometer, preferably equal to or less than 400 micrometer, and particularly preferably equal to or less than 200 micrometer.

According to a preferred embodiment, the substrate is a metal substrate. Particularly preferably, the metal substrate is configured to be flexible. A flexible OLED can be advantageously generated by the help of a flexible substrate.

For example, the metal substrate comprises one of the following materials or is formed from one of the following materials: steel, aluminum, copper. For example, the metal substrate comprises an alloy with aluminum or copper as main component or is formed from such an alloy.

A metal substrate may have a roughness from only a few nanometers up to several micrometers. In the present case, the metal substrate has a roughness of equal to or less than 1 micrometer. For example, the metal substrate has a roughness between 600 nanometers and 800 nanometers. Thus, a planarization layer described below is particularly preferably used with a metal substrate.

Furthermore, it is also possible that the substrate is formed by a plastic film. Particularly preferably, the plastic film is configured to be flexible. For example, the plastic film comprises one of the following materials or is formed from one of the following materials: PET, PEN, Polyimide, PEEK. Just as well, a planarization layer is preferably used when using a plastic film as the substrate, in order to compensate roughness of the surface.

According to a preferred embodiment, the organic layer stack and the buffer layer comprise small molecules or are formed from small molecules. In other words, the material which is preferably comprised both by the buffer layer and also by the organic layer stack are small molecules.

The substance class of small molecules includes low-molecular compounds having a low molecular mass, in particular when compared to long-chain polymers. In particular, low-molecular chemical compounds and short-chain organic molecules with conjugated double bonds are referred to as small molecules. Small molecules can usually be deposited in layers by vacuum-based processes such as vapor deposition. In contrast, long-chain polymers are usually processed in solution and applied in layers by printing or spin-coating. Suitable materials of the small molecules substance class for individual layers of the organic layer stack, which are also suitable for the formation of the buffer layer, have been described above yet.

Particularly preferably, the buffer layer is formed from a material, which is used in the organic layer stack while being also directly adjacent to the first electrode.

For example, a hole-conducting organic layer is directly adjacent to the first electrode. Particularly preferably, the buffer layer is thus formed from a material which can also be used for a hole-conducting layer. Furthermore, it is to be possible that the material for the hole-conducting layer is vapor-deposited at a high rate.

According to a preferred embodiment of the OLED, the buffer layer is formed from a material which can be deposited by vapor-deposition.

Alternatively, it is also possible for the buffer layer to be formed from a material that can be deposited by wet deposition.

Furthermore, materials that include metal complexes or consist of metal complexes are suitable for the buffer layer. These materials usually have the advantage of being particularly cost-efficient.

In particular, materials that include Cu-complexes, Zn-complexes or Bi-complexes or consist of one of these complexes are suitable in this case. Such materials are described, e.g., in the following specifications, the disclosure content of which is incorporated herein by reference: WO 2011/033023 A1, DE 10 2010 062 877 A1.

Furthermore, for example, suitable Zn-carboxylate complexes are described as p-dopants in the specification DE 10 2014 114 224 A1, the disclosure of which is also incorporated herein by reference, while the specification DE 10 2014 114 231.4, the disclosure content of which is also incorporated herein by reference, describes suitable metal organic benzoate complexes with perfluoro alkyl substituents.

The specification WO 2013/182389 A2 finally describes polynuclear main group metal complexes as p-dopants, while the specification DE 10 2011 084 639 A1 addresses copper azomethine complexes low in electrons. In this respect, the disclosure content of the specification WO 2013/182389 A2 and DE 10 2011 084 639 A1 is also incorporated herein by reference.

The specifications US 2011/089408 A1 and US 2014/107364 A1, the disclosure content of which is also incorporated herein by reference, finally describe suitable polynuclear Cu(I) complexes and Cu(II) complexes.

In particular, organic dopants, also as pure substances, can be vapor-deposited for the formation of the buffer layer. Furthermore, it is also possible that the proportion of the p-dopant is configured to be relatively high and a matrix of the p-dopant only serves to prevent a crystallization of the layer and promote good layer growth.

Particularly preferably, the buffer layer is in direct contact with the first electrode. In other words, the buffer layer and the first electrode have a common interface. Particularly preferably, the layer of the organic layer stack, which is directly adjacent to the first electrode, is formed from the same material as the buffer layer. This provides the advantage that the first electrode is in direct contact with the same or a similar material on both sides and thus has to be adapted only to this material.

For example, it is advantageous when the first electrode and the organic material of the buffer layer and the organic layer stack are adapted in terms of adhesion, growth behavior as well as chemical and mechanical properties.

According to another embodiment, a polymeric planarization layer is arranged between the substrate and the buffer layer. The polymeric planarization layer particularly preferably comprises or consists of a polymer. In other words, the planarization layer is preferably formed from a polymer, in contrast to the buffer layer, which is preferably formed from small molecules. Preferably, the polymeric planarization layer is applied to the substrate in direct contact. Due to the long-chain molecular structure of the polymers, the polymeric planarization layer is particularly suitable to compensate unevenness of the substrate.

For example, the polymeric planarization layer can contain one of the following materials or consist of one of the following materials: epoxy resin, acrylate resin, polyurethane resin, polyamide resin, polyimide resin, silicone resin.

The polymeric planarization layer has a thickness between including 0.2 micrometer and including 30 micrometer that depends, for example, on the polymer, the application method and the roughness of the substrate. Preferably, the polymeric planarization layer has a thickness between including 1 micrometer and including 15 micrometer and very preferably between including 2 micrometer and including 10 micrometer.

The buffer layer has a thickness between including 10 nanometer and including 1.2 micrometer, for example. Preferably, the buffer layer has a thickness between including 100 nanometer and including 800 nanometer and particularly preferably between including 200 nanometer and including 600 nanometer.

According to a particularly preferred embodiment of the OLED, the planarization layer is applied to the substrate in direct contact and the buffer layer is applied to the planarization layer in direct contact. Preferably, the first electrode is finally applied to the buffer layer in direct contact. Particularly preferably, the organic layer stack is applied to the first electrode in direct contact. In this embodiment, the polymeric planarization layer can advantageously compensate the unevenness of the substrate, while the buffer layer, which is in direct contact with the first electrode, is particularly compatible with the electrode material.

Advantageously, the buffer layer protects the first electrode arranged on it, e.g., from outgassing such as volatile organic compounds (VOC, for short) or even solvents from the polymeric planarization layer. Furthermore, it is also possible that the buffer layer protects the first electrode from contaminations such as halogenic contaminations from the polymer synthesis or from additives, e.g., catalysts or cross-link initiators from the polymeric planarization layer. In addition, the buffer layer can protect the first electrode from water residues from the polymeric planarization layer, or from particles that accumulated in the apparatus for electrode/organic coating prior to the introduction of the substrate.

One idea of the present application is to use an organic buffer layer, which is formed from a material, which is used or could be used in the organic layer stack, besides a polymeric planarization layer, which has a comparatively high thickness. In particular, the organic layer stack and the buffer layer can be formed from small molecules. Advantageously, the buffer layer insulates the sensitive electrode from the polymeric planarization layer and protects it from volatile organic components and solvent residues that can be present in the polymer buffer layer. In this way, defects in the light-emitting surface of the OLED, so-called "dark spots", can at least be reduced. Furthermore, smaller particles can be covered and evened by the buffer layer.

According to another embodiment of the OLED, the material of the organic layer stack extends along a side surface of the first electrode all the way to the substrate and electrically insulates the first electrode from the second electrode. In this embodiment, the second electrode particularly preferably extends laterally over the underlying organic material all the way to the substrate. If the substrate is formed to be electrically conductive, e.g., in the case of a metal substrate, the second electrode can be easily externally contacted electrically via this substrate. Furthermore, it is also possible that the second electrode extends merely to the polymeric planarization layer. In this embodiment, the first electrode and/or the second electrode may have a rectangular basic shape, which has a bulge on one side thereof. In this case, the bulge protrudes laterally from the organic layer stack and the buffer layer. The respective electrode can be externally electrically contacted via this bulge.

According to one embodiment of the OLED, the OLED is provided to emit radiation, which is generated during operation of the OLED, through the substrate (bottom emitter). In this embodiment, the buffer layer preferably has a refractive index of at least 1.6 and very preferably of at least 1.8. In this way, the out-coupling of the OLED can be increased.

In a method for producing an OLED, a substrate is provided. A buffer layer is deposited then. Preferably, the buffer layer is deposited by vapor-deposition. Particularly preferably, a comparatively high deposition rate is used, since this permits thick layers in short process times.

For example, the deposition rate has a value between including 0.1 angstrom per second and including 100 angstrom per second. Preferably, the deposition rate has a value between including 1 angstrom per second and including 50 angstrom per second, and particularly preferably a value between including 5 angstrom per second and including 15 angstrom per second.

Alternatively, it is conceivable that the buffer layer is deposited by wet deposition.

The buffer layer is preferably deposited on or over the substrate, i.e., the buffer layer is either applied to the substrate in direct contact or there are one or multiple layers between the buffer layer and the substrate. Cross-linking via UV radiation is conceivable for suitable materials for the buffer layer.

Finally, an organic layer stack is deposited, preferably by vapor-deposition, which is arranged between a first electrode and a second electrode, wherein the buffer layer is formed from an organic material. Preferably, the buffer layer is formed from an organic semiconductor material, e.g., from small molecules. Particularly preferably, the buffer layer is formed from an organic material, which is also comprised by the organic layer stack.

Particularly preferably, the buffer layer and the organic layer stack are vapor-deposited through the same mask. This is particularly possible if the buffer layer is formed from a material which is also comprised by the organic layer stack or could be used in the organic layer stack. Using the same mask advantageously results in a simplified manufacturing process and allows positioning the buffer layer exactly in relation to the organic layer stack.

Particularly preferably, the buffer layer and the organic layer stack are deposited in the same apparatus, particularly preferably without the workpiece leaving the apparatus in the meantime. In this way, contamination of the future OLED by harmful substances or particles can at least be reduced in production.

According to a particularly preferred embodiment of the method, the substrate is applied to a polymeric planarization layer. The buffer layer is applied to the polymeric planarization layer, and the first electrode is applied to the polymeric planarization layer.

Features and embodiments that have presently been disclosed merely in conjunction with the OLED can also be embodied in the production method and vice versa.

BRIEF DESCRIPTION OF THE DRAWINGS

Further advantageous embodiments and developments of the invention result from the exemplary embodiments described hereinafter in conjunction with the Figures.

One exemplary embodiment of a method for producing an OLED is described in more detail by means of the schematic sectional views of FIGS. 1 to 6.

Figure 1:

Like, similar or equivalent elements are indicated with like reference numerals throughout the Figures. The Figures and the size ratios of the elements illustrated in the Figures are not to be considered as being made to scale. Individual elements, in particular layer thicknesses, may rather be illustrated in an exaggerated size for a better illustration and/or better understanding.

DETAILED DESCRIPTION OF ILLUSTRATIVE EMBODIMENTS

In the exemplary embodiment according to FIGS. 1 to 6, a flexible metal substrate 1, e.g., of steel, is provided in a first step (FIG. 1).

Figure 2:
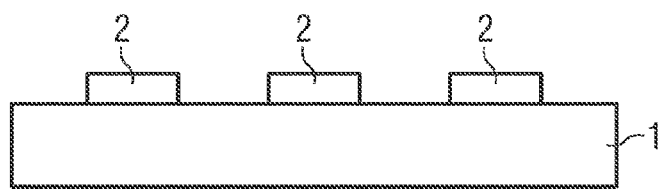

In a next step, which is schematically shown in FIG. 2, a polymeric planarization layer 2 is applied to the substrate 1. The planarization layer 2 is formed from a polymer. For example, the polymeric planarization layer 2 is deposited on the substrate 1 with one of the following methods: printing, e.g., screen-printing or intaglio-printing, inkjet printing, spin-coating, rotation coating, slot die coating, dispensing.

For example, the polymeric planarization layer 2 can be applied to the substrate 1 in a structured manner, wherein each structural element will later be part of a finished OLED. To that end, the polymeric planarization layer 2 is first applied over the entire surface of substrate 1, e.g., by spin coating or rotation coating and then patterned by exposure and development. As an alternative, it is also possible to leave the polymeric planarization layer 2 on the entire surface of the substrate 1.

Figure 3:
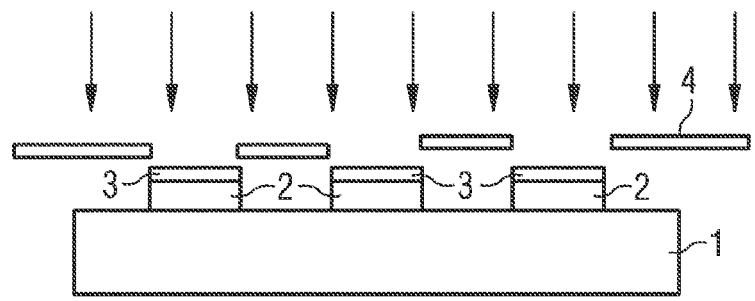
Figure 4:
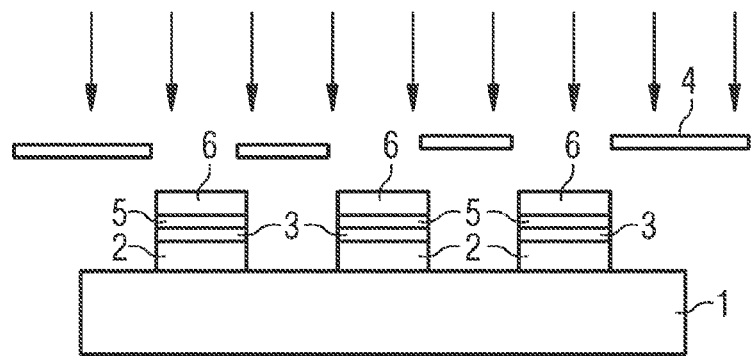

In a next step, which is schematically shown in FIG. 3, a buffer layer 3 is deposited on the polymeric planarization layer 2 in direct contact. To that end, a mask 4 is used, which covers places of the substrate 1 that are not to be provided with the buffer layer 3. Here, the buffer layer 3 is preferably formed from small molecules.

Then, a first electrode 5 is applied to the buffer layer 3 in direct contact (not shown). An organic layer 6 is vapor-deposited on the first electrode 5, again by means of that mask 4 which had already been used in the deposition process of the buffer layer 3, the organic layer stack comprising an active light-generating layer, which is suitable to emit electromagnetic radiation. In the present case, the organic layer stack 6, just like the buffer layer 3, is preferably formed from small molecules. Preferably, the organic layer stack 6 comprises an organic material, which is also comprised by the buffer layer 3 or from which the buffer layer 3 is formed.

Figure 5:
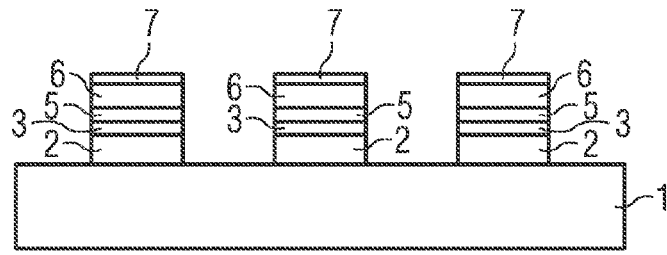

Finally, a second electrode 7 is deposited on the organic layer stack 6 (FIG. 5).

Figure 6:
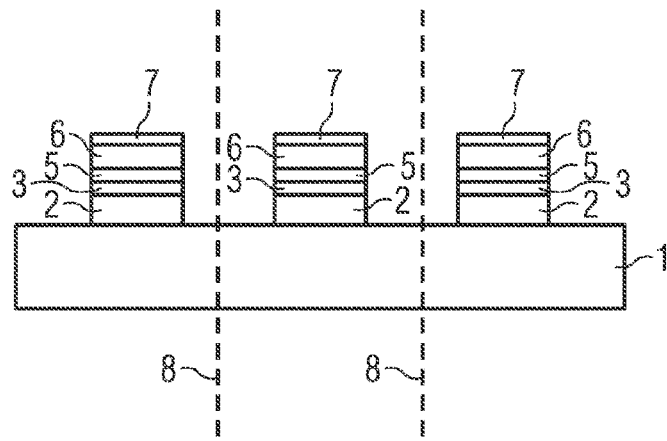

In a next step, which is schematically shown in FIG. 6, the substrate 1 is severed along separation lines 8, so that a plurality of OLEDS is produced. Basically, it is also conceivable that a single OLED is produced on a substrate. In this case, this step is omitted.

In FIGS. 1 to 6, the individual layers of the OLED are shown to have the same lateral extent. However, it is to be noted at this point that this is a purely schematic simplification and does not necessarily have to be embodied in the described method. The lateral extents of the individual layers may rather be different, as described with respect to FIGS. 7 to 10 in an exemplary manner.

Figure 7:
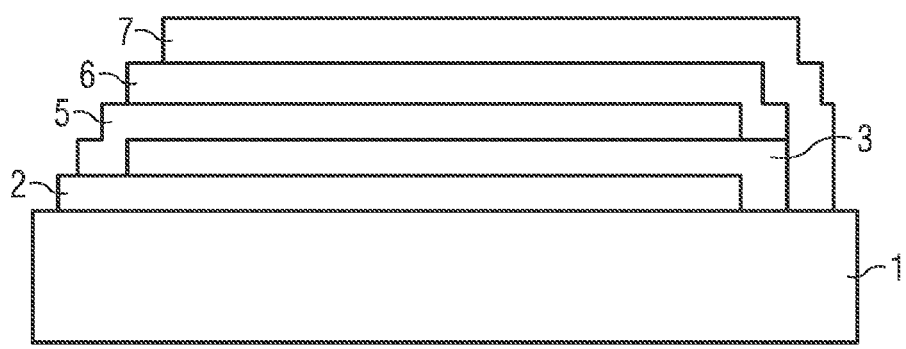
FIG. 7 shows a schematic sectional view of an OLED according to one exemplary embodiment.

The OLED according to the exemplary embodiment of FIG. 7 comprises a substrate 1, on which a polymeric planarization layer 2, which preferably consists of a polymer, is applied in direct contact. The substrate 1 preferably is a flexible metal substrate, e.g., of steel. A buffer layer 3 is applied to the polymeric planarization layer 2. The buffer layer 3 is formed from an organic material. Preferably, the buffer layer 3 is formed from small molecules.

A first electrode 5, in this case the anode, is applied to the buffer layer 3. The first electrode 5 extends along a side surface of the buffer layer 3 all the way to the polymeric planarization layer 2.

An organic layer stack 6, which comprises an active light-generating layer, which is suitable to emit visible light, is applied to the first electrode 5 in direct contact. A material of the organic layer stack 6 extends over a side surface of the first electrode 5 all the way to the buffer layer 3, and further over a side surface of the polymeric planarization layer 2 all the way to the substrate 1. The first electrode 5 is thereby electrically insulated from a second electrode 7, which is located on the organic layer stack 6 in direct contact.

The second electrode 7, which is the cathode in the present case, also extends over the entire side surface of the underlying layer stack all the way to the substrate 1. In this way, in the case of a conductive substrate 1, as in the present steel substrate, an external electric contacting can be advantageously effected via the substrate 1.

Figure 8:
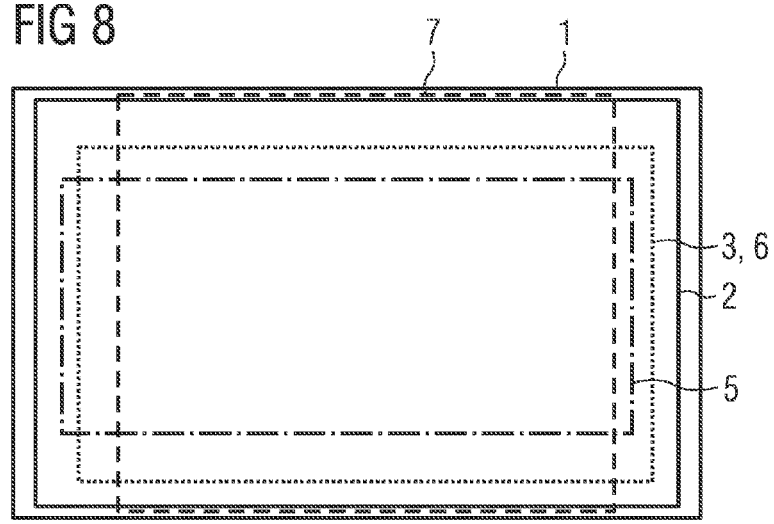
FIG. 8 shows a schematic plan view of the OLED according to the exemplary embodiment of FIG. 7.

FIG. 8 shows a schematic plan view of the OLED according to the exemplary embodiment of FIG. 7, and in particular a limitation of the lateral extent and the basic shapes of the individual layers of the OLED.

As shown in FIG. 8, the substrate 1, the polymeric planarization layer 2, the buffer layer 3, the first electrode 5, the organic layer stack 6 and the second electrode 7 have a rectangular basic shape in the present exemplary embodiment.

In the OLED according to the exemplary embodiment of FIGS. 7 and 8, the polymeric planarization layer 2 covers a central region of the substrate 1 over the entire surface, while a narrow circumferential peripheral region of the substrate 1 is free from the polymeric planarization layer 2.

The buffer layer 3 and the organic layer stack 6 have the same lateral extent and are arranged one above the other to be congruent. Thus, FIG. 8 shows a common limitation, which completely runs within the limitation of the polymeric planarization layer 2. The buffer layer 3 and the organic layer stack 6 are arranged within the polymeric planarization layer 2.

In contrast, the first electrode 5 and the second electrode 7 are arranged offset to one another. The first electrode 5 protrudes from the limitation of the second electrode 7 and the planarization layer 2 on two opposite sides, while the second electrode 7 protrudes from the limitation of the first electrode 5 on the other two sides.

Furthermore, the first electrode 5 and the second electrode 7 are each arranged offset to the organic layer stack 6. The first electrode 5 and the second electrode 7 protrude from the organic layer stack 6 on two different sides. The first electrode 5 and the second electrode 7 can each be externally electrically contacted on the regions that laterally protrude from the organic layer stack 6.

Figure 9:
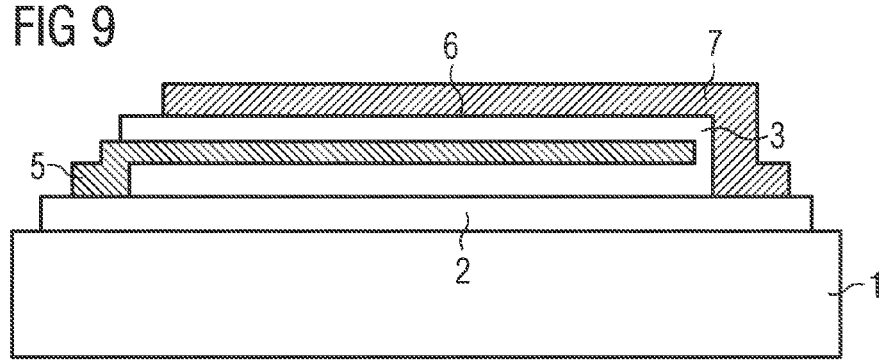
FIG. 9 shows a schematic sectional view of an OLED according to another exemplary embodiment.
Figure 10:
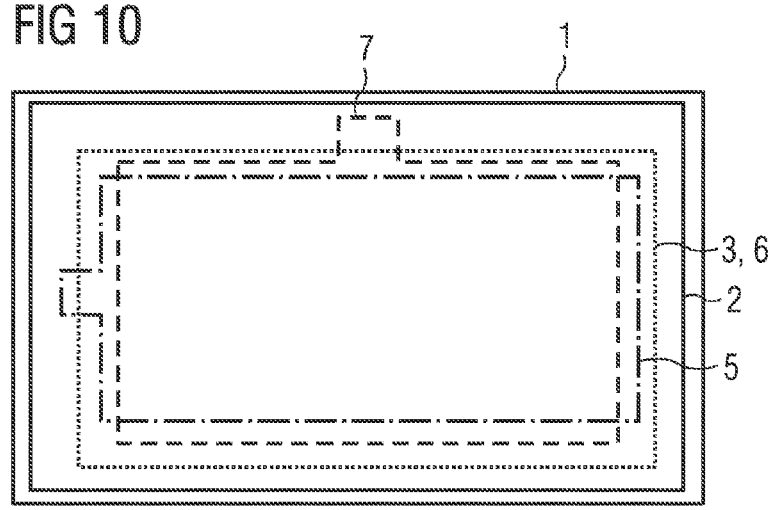
FIG. 10 shows a schematic plan view of the OLED according to the exemplary embodiment of FIG. 9.

The OLED according to the exemplary embodiment of FIGS. 9 and 10 comprises a first electrode 5, which ends on a main surface of the polymeric planarization layer 2.

Just like the schematic plan view of FIG. 10 of the OLED according to FIG. 9, the substrate 1, the polymeric planarization layer 2, the organic layer stack 6 and the buffer layer 3 have a rectangular basic shape. The arrangement of the substrate 1, the polymeric planarization layer 2, the organic layer stack 6 and the buffer layer 3 in relation to one another is also configured as in the exemplary embodiment according to FIGS. 7 and 8, wherein the planarization layer 2 has a smaller lateral extent.

However, in contrast to the exemplary embodiment of FIGS. 7 and 8, the shape of the first electrode 5 and of the second electrode 7 each have a bulge on in each case one side of the rectangular basic shape. The first electrode 5 and the second electrode 7 are arranged in such a way that the respective bulge protrudes from the organic material of the buffer layer 3 and the layer stack 6, so that each electrode 5, 7 can be externally electrically contacted via the bulge thereof.

The invention is not limited to these exemplary embodiments by the description by means of the exemplary embodiments. The invention rather comprises each new feature as well as each combination of features, particularly including each combination of features in the patent claims, even though this features or this combination is not per se explicitly indicated in the patent claims or exemplary embodiments.

The invention claimed is:

1. An OLED comprising:
   a substrate;
   an organic layer stack with at least one active light-generating layer, which is suitable for generating electromagnetic radiation, wherein the organic layer stack is arranged between a first electrode and a second electrode; and
   a buffer layer arranged between the substrate and the first electrode, wherein the buffer layer comprises an organic material,
   wherein a polymeric planarization layer is in direct contact with the substrate,
   wherein the buffer layer is in direct contact with the polymeric planarization layer, and
   wherein the first electrode is in direct contact with the buffer layer.

2. The OLED according to claim 1, wherein the buffer layer comprises an organic semiconductor material.

3. The OLED according to claim 1, wherein the buffer layer is formed from an organic material, which is also comprised by the organic layer stack.

4. The OLED according to claim 3, wherein the organic layer stack and the buffer layer comprise small molecules.

5. The OLED according to claim 1, wherein the buffer layer comprises the organic material that is depositable by vapor-deposition.

6. The OLED according to claim 1, wherein the buffer layer comprises the organic material that is applicable by wet deposition.

7. The OLED according to claim 1, wherein the buffer layer comprises a material that comprises metal complexes.

8. The OLED according to claim 1, wherein a lateral extent of the organic layer stack and a lateral extent of the buffer layer are equal.

9. The OLED according to claim 1, wherein the substrate is a flexible metal substrate or a flexible plastic film.

10. The OLED according to claim 1, wherein a material of the organic layer stack extends along a side surface of the first electrode all the way to the substrate and electrically insulates the first electrode from the second electrode.

11. The OLED according to claim 1, wherein the OLED is configured to emit radiation, which is generated during operation of the OLED, through the substrate, and wherein the buffer layer has a refractive index of at least 1.6.

12. An OLED comprising:
    a substrate;
    an organic layer stack with at least one active light-generating layer, which is suitable for generating electromagnetic radiation, wherein the organic layer stack is arranged between a first electrode and a second electrode; and
    a buffer layer arranged between the substrate and the first electrode,
    wherein the buffer layer comprises an organic material,
    wherein the buffer layer is located directly adjacent to the first electrode, and
    wherein a layer of the organic layer stack directly adjacent to the first electrode and the buffer layer comprise the same material.

13. A method for manufacturing an OLED, the method comprising:
    providing a substrate;
    depositing a buffer layer; and
    vapor-depositing an organic layer stack, which is arranged between a first electrode and a second electrode, wherein the buffer layer is formed from an organic material,
    wherein a polymeric planarization layer is directly applied to the substrate,
    wherein the buffer layer is directly applied to the polymeric planarization layer, and
    wherein the first electrode is directly applied to the buffer layer.

14. The method according to claim 13, wherein depositing the buffer layer comprises vapor-depositing the buffer layer.

15. The method according to claim 14, wherein the buffer layer and the organic layer stack are vapor-deposited through the same mask.

16. The method according to claim 13, wherein the buffer layer comprises small molecules.

17. The method according to claim 13, wherein the buffer layer is deposited by wet deposition.

18. A method for manufacturing an OLED, the comprising:
    providing a substrate;
    depositing a buffer layer; and
    vapor-depositing an organic layer stack, which is arranged between a first electrode and a second electrode, wherein the buffer layer is formed from an organic material,
    wherein the buffer layer is directly adjacent to the first electrode, and
    wherein a layer of the organic layer stack that is directly adjacent to the first electrode and the buffer layer are formed from the same material.

* * * * *